United States Patent
Tada et al.

(10) Patent No.: US 7,502,724 B2
(45) Date of Patent: Mar. 10, 2009

(54) TEST SIMULATOR, TEST SIMULATION PROGRAM AND RECORDING MEDIUM

(75) Inventors: Hideki Tada, Tokyo (JP); Mitsuo Hori, Tokyo (JP); Takahiro Kataoka, Tokyo (JP)

(73) Assignee: Advantest Corporation, Tokyo (JP)

( * ) Notice: Subject to any disclaimer, the term of this patent is extended or adjusted under 35 U.S.C. 154(b) by 382 days.

(21) Appl. No.: 11/240,811

(22) Filed: Sep. 30, 2005

(65) Prior Publication Data

US 2006/0085682 A1 Apr. 20, 2006

Related U.S. Application Data

(63) Continuation of application No. PCT/JP2005/017396, filed on Sep. 21, 2005.

(30) Foreign Application Priority Data

Sep. 24, 2004 (JP) .............................. 2004-278582

(51) Int. Cl.
*G06F 17/50* (2006.01)

(52) U.S. Cl. .............................. 703/14; 716/4; 714/718; 714/724; 714/738

(58) Field of Classification Search ..................... 703/14
See application file for complete search history.

(56) References Cited

U.S. PATENT DOCUMENTS

| 5,809,039 | A | * | 9/1998 | Takahashi et al. | ........... 714/726 |
| 5,913,022 | A | * | 6/1999 | Tinaztepe et al. | ............. 714/25 |
| 6,041,429 | A | * | 3/2000 | Koenemann | ................ 714/738 |
| 6,167,545 | A | * | 12/2000 | Statovici et al. | ............. 714/724 |
| 6,249,891 | B1 | | 6/2001 | Matsumura et al. | |

(Continued)

FOREIGN PATENT DOCUMENTS

JP 63231279 9/1988

(Continued)

OTHER PUBLICATIONS

Wriiten Opinion of the International Searching Authority, English Translation, PCT/JP2005/017396.*

(Continued)

*Primary Examiner*—Paul L Rodriguez
*Assistant Examiner*—Mary C Jacob
(74) *Attorney, Agent, or Firm*—Osha - Liang LLP

(57) ABSTRACT

A test simulator for simulating a test of a semiconductor device is disclosed, the test simulator including: a test pattern holding unit for holding an existing test pattern to be supplied to the semiconductor device; a device output holding unit for preliminarily holding an output to be obtained from the semiconductor device when the existing test pattern is supplied; a test pattern generating unit for generating a new test pattern to be supplied to the semiconductor device; a test pattern deciding unit for deciding whether the new test pattern is equal to the existing test pattern; and a simulation skipping unit for skipping at least a part of a simulation test by reading an output from the device output holding unit and using the output as an output for the new test pattern without supplying the new test pattern to the semiconductor device when the test patterns are equal to each other.

15 Claims, 6 Drawing Sheets

U.S. PATENT DOCUMENTS

| | | | |
|---|---|---|---|
| 6,308,292 B1 | 10/2001 | Fusco | |
| 6,321,363 B1 * | 11/2001 | Huang et al. | 716/4 |
| 6,973,633 B2 * | 12/2005 | Lippincott et al. | 716/11 |
| 7,162,674 B2 * | 1/2007 | Nozuyama | 714/741 |
| 7,360,116 B2 * | 4/2008 | Nakamura | 714/30 |

FOREIGN PATENT DOCUMENTS

| | | |
|---|---|---|
| JP | 3-61871 | 3/1991 |
| JP | 2002-215712 | 8/2002 |
| JP | 2003-315419 | 11/2003 |

OTHER PUBLICATIONS

Liu et al, "A Design-for-Verification Technique for Functional Pattern Reduction", IEEE Design and Test of Computers, vol. 20, No. 2, pp. 48-55, Mar./Apr. 2003.*

Konemann, Bernd, "A Pattern Skipping Method for Weighted Random Pattern Testing", European Test Conference, 1993, pp. 418-425.*

Patent Abstracts of Japan, Publication No.: 2002-215712, Publication Date: Aug. 2, 2002, 1 page.

Patent Abstracts of Japan, Publication No. 2003-315419, Publication Date: Nov. 6, 2003; (2 pages).

Patent Abstracts of Japan, Publication No.: 3-61871, Publication Date: Mar. 18, 1991, (2 pages).

Search Report for PCT/JP2005/017396, dated Jan. 10, 2006 (2 pages).

Extended EP Search report issued in EP Application No. 05785167.7 dated Jun. 20, 2008 (3 pages).

* cited by examiner

316

| INDEX | EXISTING TEST PATTERN | VALUE OF INTERNAL REGISTER AT START-UP |
|---|---|---|
| 0 | 15ns : ↑<br>25ns : ↓<br>32ns : ↑<br>⋮ | R0 = 5A83<br>R1 = 0426<br>R2 = 8B91<br>⋮ |
| 1 | 5ns : ↑<br>24ns : ↓<br>50ns : ↑<br>⋮ | R0 = 0042<br>R1 = 5396<br>R2 = AC88<br>⋮ |
| 2 | 10ns : ↑<br>20ns : ↓<br>48ns : ↑<br>⋮ | R0 = 9106<br>R1 = 0020<br>R2 = 341D<br>⋮ |
| ⋮ | ⋮ | ⋮ |

| INDEX | OUTPUT |
|---|---|
| 0 | 20ns : ↑<br>30ns : ↓<br>46ns : ↑<br>⋮ |
| 1 | 12ns : ↑<br>30ns : ↓<br>65ns : ↑<br>⋮ |
| 2 | 16ns : ↑<br>28ns : ↓<br>72ns : ↑<br>⋮ |
| ⋮ | ⋮ |

| INDEX | VALUE OF INTERNAL REGISTER AT TERMINATION |
|---|---|
| 0 | R0 = 14E8<br>R1 = 603A<br>R2 = 2599<br>⋮ |
| 1 | R0 = 663B<br>R1 = E80A<br>R2 = CD63<br>⋮ |
| 2 | R0 = 2058<br>R1 = 14BA<br>R2 = 83C2<br>⋮ |
| ⋮ | ⋮ |

*FIG. 4*

TEST SIMULATOR, TEST SIMULATION PROGRAM AND RECORDING MEDIUM

This is a continuation application of PCT/JP2005/017396 filed on Sep. 21, 2005, which claims priority from a Japanese Patent application No. JP 2004-278582 filed on Sep. 24, 2004, the contents of which are incorporated herein by reference.

BACKGROUND OF THE INVENTION

1. Field of the Invention

The present invention relates to a test simulator, a test simulation program, and a recording medium. More particularly, the present invention relates to a test simulator and a test simulation program simulating a test of a semiconductor device, and a recording medium.

2. Description of Related Art

Now the design of a semiconductor device such as VLSI is conducted by a hardware description language (HDL) such as Verilog-HDL and VHDL by means of a computer. Further, design using such a HDL is verified to confirm whether the function intended by a designer (e.g., behavioral levels or gate levels) is carried out by using a device simulator (Verilog-HDL/VHDL simulator) before the design is manufactured as a silicon IC. For example, a technique for simulating a test of a semiconductor device performed by a semiconductor testing apparatus to verify the design of the semiconductor device by means of a simulator based on HDL is disclosed, for example, in Japanese Patent Application Publication No. 2002-215712.

However, the operating speed of a semiconductor device simulated by such a device simulator is very low compared to the operating speed of a real semiconductor device. Therefore, a test of a semiconductor device simulated by means of a device simulator requires a very long time compared with a test using a real semiconductor testing apparatus and semiconductor device. For this reason, the design automation of a semiconductor device cannot be achieved with high efficiency, and there has been a need for a test simulator that simulates a test efficiently.

SUMMARY OF THE INVENTION

Therefore, it is an object of the present invention to provide a test simulator, a test simulation program, and a recording medium that can solve the foregoing problems. The above and other objects can be achieved by combinations described in the independent claims. The dependent claims define further advantageous and exemplary combinations of the present invention.

To achieve this object, according to the first aspect of the present invention, there is provided a test simulator simulating a test of a semiconductor device. The test simulator includes: a test pattern holding means for holding an existing test pattern to be supplied to the semiconductor device; a device output holding means for previously holding an output to be obtained from the semiconductor device when the existing test pattern is supplied to the semiconductor device; a test pattern generating means for generating a new test pattern to be supplied to the semiconductor device; a test pattern deciding means for deciding whether the new test pattern is equal to the existing test pattern; and a simulation skipping means for skipping at least a part of a simulation test by reading an output from the device output holding means and using the output as an output for the new test pattern output from the semiconductor device without supplying the new test pattern to the semiconductor device when the new test pattern is equal to the existing test pattern.

The test simulator may further include a device output generating means for generating an output from the semiconductor device by supplying the new test pattern to a device simulating means simulating an operation of the semiconductor device to operate the device simulating means when the new test pattern is not equal to the existing test pattern. The test simulator may further include the device simulating means. The test pattern holding means may include a test pattern storing means for storing the new test pattern generated from the test pattern generating means, and the device output holding means may include a device output storing means for storing the output from the semiconductor device generated from the device simulating means according to the new test pattern.

The test pattern holding means may further hold a value of an internal register in the semiconductor device when the existing test pattern begins to be supplied, and the simulation skipping means may skip at least a part of the simulation test on condition that a value of the internal register in the semiconductor device when the new test pattern begins to be supplied to the semiconductor device is equal to the value of the internal register held in the test pattern holding means. The test pattern holding means may include a start register value storing means for receiving and storing the value of the internal register in the semiconductor device, when the new test pattern begins to be supplied to the device simulating means, from the device simulating means.

The test pattern holding means may hold a plurality of combinations of the value of the internal register in the semiconductor device, when the existing test pattern begins to be supplied to the device simulating means, and the existing test pattern, the device output holding means may hold the output to be obtained from the semiconductor device when the existing test pattern is supplied in association with each of the plurality of existing test patterns, and the simulation skipping means may skip at least a part of the simulation test when a combination of the value of the internal register in the semiconductor device, when the new test pattern begins to be supplied, and the new test pattern is equal to either of the combinations held in the test pattern holding means.

The test simulator may further include: a termination register value holding means for holding a value of the internal register in the semiconductor device after the existing test pattern stops being supplied; and a register value setting means for setting the value of the internal register held in the termination register value holding means in the internal register in the semiconductor device when at least a part of the simulation test is skipped by the simulation skipping means, and the test pattern generating means may generate the new test pattern in order to resume the simulation test skipped by the simulation skipping means. The termination register value holding means may include a termination register value storing means for receiving and storing a value of the internal register in the semiconductor device, after the new test pattern stops being supplied to the device simulating means, from the device simulating means.

According to the second aspect of the present invention, there is provided a test simulation program making a computer function as a test simulator simulating a test of a semiconductor device. The test simulator includes: a test pattern holding means for holding an existing test pattern to be supplied to the semiconductor device; a device output holding means for previously holding an output to be obtained from the semiconductor device when the existing test pattern is supplied to the semiconductor device; a test pattern generating means for generating a new test pattern to be supplied to the semiconductor device; a test pattern deciding means for deciding whether the new test pattern is equal to the existing test pattern; and a simulation skipping means for skipping at least a part of a simulation test by reading an output from the device output holding means and using the output as an output for the new test pattern output from the semiconductor device without supplying the new test pattern to the semiconductor device when the new test pattern is equal to the existing test pattern.

The test simulator may further include a device output generating means for generating an output from the semiconductor device by supplying the new test pattern to a device simulating means simulating an operation of the semiconductor device to operate the device simulating means when the new test pattern is not equal to the existing test pattern. The test simulator may further include the device simulating means. The test pattern holding means may include a test pattern storing means for storing the new test pattern generated from the test pattern generating means, and the device output holding means may include a device output storing means for storing the output from the semiconductor device generated from the device simulating means according to the new test pattern.

The test pattern holding means may further hold a value of an internal register in the semiconductor device when the existing test pattern begins to be supplied, and the simulation skipping means may skip at least a part of the simulation test on condition that a value of the internal register in the semiconductor device when the new test pattern begins to be supplied to the semiconductor device is equal to the value of the internal register held in the test pattern holding means. The test pattern holding means may include a start register value storing means for receiving and storing the value of the internal register in the semiconductor device, when the new test pattern begins to be supplied to the device simulating means, from the device simulating means.

The test pattern holding means may hold a plurality of combinations of the value of the internal register in the semiconductor device, when the existing test pattern begins to be supplied to the device simulating means, and the existing test pattern, the device output holding means may hold the output to be obtained from the semiconductor device when the existing test pattern is supplied in association with each of the plurality of existing test patterns, and the simulation skipping means may skip at least a part of the simulation test when a combination of the value of the internal register in the semiconductor device, when the new test pattern begins to be supplied, and the new test pattern is equal to either of the combinations held in the test pattern holding means.

The test simulator may further include: a termination register value holding means for holding a value of the internal register in the semiconductor device after the existing test pattern stops being supplied; and a register value setting means for setting the value of the internal register held in the termination register value holding means in the internal register in the semiconductor device when at least a part of the simulation test is skipped by the simulation skipping means, and the test pattern generating means may generate the new test pattern in order to resume the simulation test skipped by the simulation skipping means. The termination register value holding means may include a termination register value storing means for receiving and storing a value of the internal register in the semiconductor device, after the new test pattern stops being supplied to the device simulating means, from the device simulating means.

According to the third aspect of the present invention, there is provided a recording medium recording the test simulation program.

The summary of the invention does not necessarily describe all necessary features of the present invention. The present invention may also be a sub-combination of the features described above.

According to the present invention, it is possible to efficiently simulate a test of a semiconductor device to shorten the time required for a simulation test when simulating the test by means of a device simulator having slow operating speed compared with a real semiconductor device.

BRIEF DESCRIPTION OF THE DRAWINGS

FIG. 2 is a view exemplary showing a test pattern database 316 according to an embodiment of the present invention.

FIG. 3 is a view exemplary showing a device output database 344 according to an embodiment of the present invention.

FIG. 4 is a view exemplary showing a termination register value database 364 according to an embodiment of the present invention.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
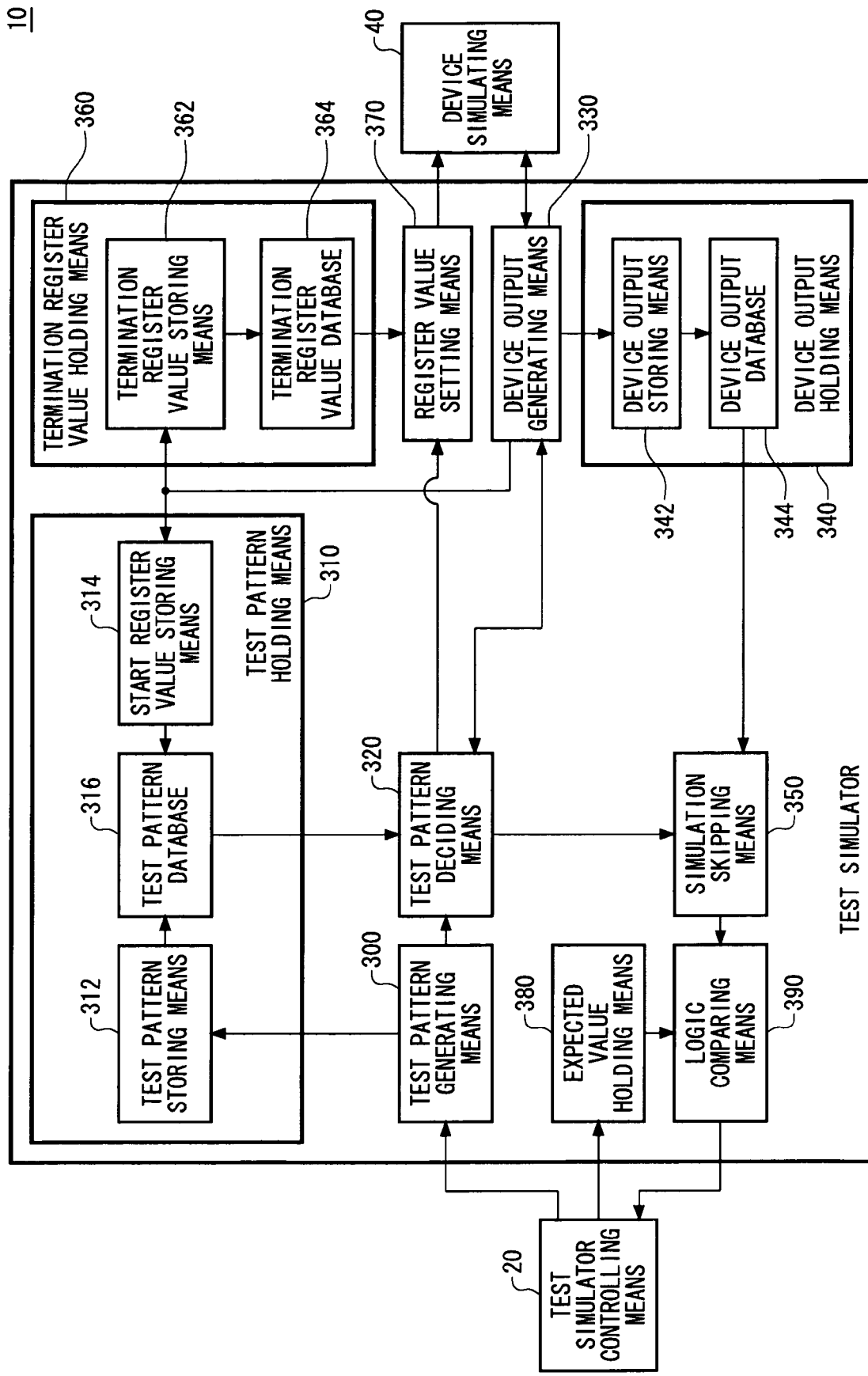
FIG. 1 is a block diagram exemplary showing a function configuration of a test simulation system 10 according to an embodiment of the present invention.

FIG. 1 is a block diagram exemplary showing a function configuration of a test simulation system 10 according to an embodiment of the present invention. The test simulation system 10 includes a test simulator controlling means 20, a test simulator 30, and a device simulating means 40. The test simulation system 10 decides the good or bad of a semiconductor device by simulating a test of the semiconductor device by means of the test simulator 30, which simulates a semiconductor testing apparatus using a software, and the device simulating means 40, which simulates the semiconductor device using a software, instead of deciding the good or bad of the semiconductor device by testing the semiconductor device by means of the semiconductor testing apparatus. In addition, the test simulation system 10 in this example supplies a test pattern to the semiconductor device, and compares an output signal output from the semiconductor device according to the test pattern with an expected value in order to simulate a functional test of deciding the good or bad of the semiconductor device.

It is an object of the test simulator 30 according to an embodiment of the present invention to shorten the time required for a simulation test by skipping a process of generating an output from a semiconductor device conducted by the device simulating means 40, when a test pattern to be supplied to the device simulating means 40 is equal to an existing test pattern such as, e.g., the test pattern used previously.

The test simulator controlling means 20 controls the test simulator 30 to make the device simulating means 40 execute a simulation test. Here, the test simulator controlling means 20 may control the test simulator 30 based on a test program in which a procedure or method of the test to be performed for the semiconductor device is described. The test program is created by a user corresponding to the semiconductor device of which an operation is simulated by the device simulating means 40. Moreover, when the test simulator 30 performs a simulated function test with respect to the device simulating means 40, the test program may include a test pattern to be supplied to the device simulating means 40, an expected value of an output of the semiconductor device generated from the device simulating means 40 according to the test pattern, and timing information indicative of the timing in which the output is compared with the expected value.

The test simulator 30 simulates a test of the semiconductor device by performing a simulated test with respect to the device simulating means 40 that simulates an operation of the semiconductor device. The test simulator 30 has a test pattern generating means 300, a test pattern holding means 310, a test pattern deciding means 320, a device output generating means 330, a device output holding means, a simulation skipping means, a termination register value holding means 360, a register value setting means 370, an expected value holding means 380, and a logic comparing means 390. In addition, in a configuration shown in the present drawing, although the test simulator 30 does not include the device simulating means 40, in another configuration, the test simulator 30 may include the device simulating means 40.

The test pattern generating means 300 generates a new test pattern to be supplied to the semiconductor device that is simulated by the device simulating means 40, and outputs the generated test pattern to the test pattern holding means 310 and the test pattern deciding means 320, based on the control by the test simulator controlling means 20. The test pattern holding means 310 includes a test pattern storing means 312, a start register value storing means 314, and a test pattern database 316. The test pattern storing means 312 stores the new test pattern generated from the test pattern generating means 300 on the test pattern database 316. The start register value storing means 314 receives a value of an internal register in the semiconductor device simulated by the device simulating means 40, when the new test pattern begins to be supplied to the device simulating means 40, from the device simulating means 40, and stores the value on the test pattern database 316. The test pattern database 316 holds an existing test pattern to be supplied to the semiconductor device simulated by the device simulating means 40. Here, the existing test pattern may be, e.g., a test pattern that has been supplied to the semiconductor device previously simulated by the device simulating means 40, or may be a predetermined test pattern such as a typical test pattern. Further, the test pattern database 316 holds a value of the internal register in the semiconductor device when the held existing test pattern begins to be supplied.

The test pattern deciding means 320 decides whether the new test pattern received from the test pattern generating means 300 is equal to the existing test pattern held in the test pattern database 316. Moreover, the test pattern deciding means 320 may receive a value of the internal register in the semiconductor device simulated by the device simulating means 40, when a new test pattern begins to be supplied, from the device simulating means 40, and further decide whether the received value of the internal register is equal to the value of the internal register, when the existing test pattern begins to be supplied, held in the test pattern database 316. In this case, although a new test pattern and an existing test pattern are equal to each other, the test pattern deciding means 320 may decide that the new test pattern and the existing test pattern are not equal when the values of the internal register are not equal, at each of the time when the new test pattern begins to be supplied and the time when the existing test pattern begins to be supplied. Then, the test pattern deciding means 320 outputs a decision result to the device output generating means 330, the simulation skipping means 350, and the register value setting means 370, and further outputs the new test pattern received from the test pattern generating means 300 to the device output generating means 330 when it is decided that the new test pattern is not equal to the existing test pattern.

When the test pattern deciding means 320 decides that the new test pattern generated from the test pattern generating means 300 is not equal to the existing test pattern held in the test pattern database 316, the device output generating means 330 supplies the new test pattern acquired from the test pattern deciding means 320 to the device simulating means 40 for simulating an operation of the semiconductor device, and generates an output from the semiconductor device by operating the device simulating means 40. Then, the device output generating means 330 receives the output of the semiconductor device, which is generated by an instruction of the device simulating means 40, and outputs the received output to the device output holding means 340. Moreover, the device output generating means 330 acquires the value of the internal register in the semiconductor device, when the new test pattern begins to be supplied to the device simulating means 40, from the device simulating means 40. Then, the device output generating means 330 outputs the acquired value of the internal register to the start register value storing means 314, and stores it on the test pattern database 316. Moreover, the device output generating means 330 outputs the acquired value of the internal register to the test pattern deciding means 320, and causes the test pattern deciding means 320 to decide whether the acquired value is equal to the value of the internal register when the existing test pattern held in the test pattern database 316 begins to be supplied. Further, the device output generating means 330 stops supplying the new test pattern to the device simulating means 40, and acquires a value of the internal register in the semiconductor device from the device simulating means 40 after generating the output of the semiconductor device. Then, the device output generating means 330 outputs the acquired value of the internal register to the termination register value holding means 360.

The device output holding means 340 outputs the output of the semiconductor device, which is generated from the device simulating means 40, received from the device output generating means 330 to the simulation skipping means 350. Moreover, the device output holding means 340 includes a device output storing means 342 and a device output database 344. The device output storing means 342 receives the output of the semiconductor device, which is generated from the device simulating means 40 according to the new test pattern generated from the test pattern generating means 300, from the device output generating means 330, and stores it on the device output database 344. The device output database 344 previously stores an output to be obtained from the semiconductor device when an existing test pattern has been supplied to the semiconductor device simulated by the device simulating means 40. In addition, the device output database 344 may hold a predetermined output such as an output according to a typical test pattern, in addition to an output stored on the device output storing means 342.

The simulation skipping means 350 receives the decision result by the test pattern deciding means 320, which decides whether the new test pattern generated from the test pattern generating means 300 is equal to the existing test pattern held in the test pattern database 316. Then, when the new test pattern is not equal to the existing test pattern, the simulation skipping means 350 receives the output of the semiconductor device according to the new test pattern, which is generated by the device simulating means 40, from the device output holding means 340, and outputs it to the logic comparing means 390. On the other hand, when the new test pattern is equal to the existing test pattern, the simulation skipping means 350 skips at least a part of a simulation test by reading an output to be obtained from the semiconductor device from the device output database 344 and using the output as an output from the semiconductor device for the new test pattern when the existing test pattern has been supplied to the semiconductor device without supplying the new test pattern to the semiconductor device simulated by the device simulating means 40. Then, when skipping at least a part of a simulation test, the simulation skipping means 350 outputs the output of the semiconductor device corresponding to the existing test pattern, which is read from the device output database 344, to the logic comparing means 390. In addition, when acquiring, from the test pattern deciding means 320, the decision result of whether the value of the internal register in the semiconductor device when the new test pattern begins to be supplied to the semiconductor device is equal to the value of the internal register when the existing test pattern begins to be supplied, the simulation skipping means 350 may skip at least a part of a simulation test on condition that the values of the internal register are equal to each other.

The termination register value holding means 360 includes a termination register value storing means 362 and a termination register value database 364. The termination register value storing means 362 receives a value of the internal register in the semiconductor device simulated by the device simulating means 40 from the device output generating means 330 after the new test pattern stops being supplied to the device simulating means 40, and stores it on the termination register value database 364. The termination register value database 364 holds a value of the internal register in the semiconductor device simulated by the device simulating means 40 after the existing test pattern stops being supplied.

When the test pattern deciding means 320 decides that the new test pattern generated from the test pattern generating means 300 is equal to the existing test pattern held in the test pattern database 316 and the simulation skipping means 350 skips at least a part of the simulation test, the register value setting means 370 reads the value of the internal register in the semiconductor device, after the existing test pattern stops being supplied, held in the termination register value database 364. Then, the register value setting means 370 sets the read value of the internal register in the internal register in the semiconductor device simulated by the device simulating means 40. Then, the test pattern generating means 300 receives this, and generates a new test pattern in order to resume the simulation test skipped by the simulation skipping means 350.

The expected value holding means 380 receives an expected value of the output of the semiconductor device, which is generated from the device simulating means 40 according to the new test pattern generated from the test pattern generating means 300, and timing information indicative of the timing, at which the output and the expected value are compared with each other, from the test simulator controlling means 20, and holds them. The logic comparing means 390 receives the output of the semiconductor device, which is generated from the device simulating means 40 according to the new test pattern generated from the test pattern generating means 300, or the output, which is read from the device output database 344 according to the existing test pattern equal to that new test pattern, from the simulation skipping means 350. Then, the logic comparing means 390 decides the good or bad of the semiconductor device simulated by the device simulating means 40 based on whether the output of the semiconductor device received from the simulation skipping means 350 is equal to the expected value held in the expected value holding means 380, at the timing based on the timing information held in the expected value holding means 380, and outputs a decision result to the test simulator controlling means 20.

According to the test simulator 30 of an embodiment of the present invention, when the new test pattern to be supplied to the device simulating means 40 is equal to the existing test pattern such as the previously supplied test pattern or a typical test pattern, it is possible to compare the output for the existing test pattern, which is previously held in the device output database 344, with the expected value by using the output as an output for the new test pattern, without generating the output of the semiconductor device to the device simulating means 40 based on the new test pattern. In this way, it is possible to skip at least a part of a process requiring a great deal of time to shorten time required for a simulation test. Here, the process is that the device simulating means 40 generates the output of the semiconductor device when the simulation test is re-executed without changing the test pattern being supplied to the device simulating means 40 as in the case of changing, e.g., the expected value compared to the output of the semiconductor device and the timing comparing the output with the expected value. On the other hand, when using a test pattern different from the existing test pattern as a new test pattern, since an output of the semiconductor device can be generated by really operating the device simulating means 40, it is possible to shorten time required for a simulation test to a maximum extent regardless of the contents of test pattern to be used.

Moreover, according to the test simulator 30, it is possible to skip at least a part of a simulation test only when the condition is satisfied that the values of the internal register in the semiconductor device, when each test pattern begins to be supplied to the device simulating means 40, are equal to one another in addition to the condition that the new test pattern and the existing test pattern are equal to each other. In this way, although the given test patterns are equal, it is possible to accurately decide whether the simulation test should be skipped when the device simulating means 40 generates an output different from one another when the values of the internal register are not equal.

When the simulation test is skipped after deciding that the new test pattern and the existing test pattern are equal to each other, since the device simulating means 40 does not operate based on the new test pattern, the internal register in the semiconductor device simulated by the device simulating means 40 is not changed. In other words, in many cases, the values of the internal register are different when the simulation test is skipped and when the simulation test is not skipped. In this case, after skipping the simulation test, it is not possible to resume the simulation test by means of a next new test pattern. For this reason, since the simulation test cannot be skipped except for a very long period such as a period from just after initialization of the internal register to next initialization of the internal register in the whole test sequence, time required for the simulation test cannot effectively be shortened.

However, according to the test simulator 30 of an embodiment of the present invention, when the simulation test is skipped after deciding that the new test pattern and the existing test pattern are equal to each other, it is possible to read the value of the internal register in the semiconductor device, after the existing test pattern previously stops being supplied to the device simulating means 40, from the termination register value database 364 and set it in the device simulating means 40. Therefore, since the internal register can have the same value when the simulation test is skipped and when the simulation test is not skipped, it is possible to resume the simulation test after skipping.

FIG. 2 is a view exemplary showing the test pattern database 316 according to an embodiment of the present invention. The test pattern database 316 holds a plurality of combinations the existing test patterns and the values of the internal register in the semiconductor device when the existing test pattern begins to be supplied to the device simulating means 40. For example, the test pattern database 316 may hold an index different from one another every the existing test pattern, the existing test pattern, and the value of the internal register in the semiconductor device when the existing test pattern begins to be supplied to the device simulating means 40, in association with one another. Here, when a new test pattern is generated by, e.g., the test pattern generating means 300, the index may be generated as a unique value about the new test pattern. Moreover, each of the existing test patterns may include, e.g., a plurality of combinations of a type of an event such as a rising edge and a falling edge of a signal and the generation timing of the event. In addition, the generation timing of the event may be, e.g., time elapsed from start time point of a test cycle in testing the semiconductor device, or may be time elapsed from generation time point of an adjacent event. Moreover, the value of the internal register may include each value of a plurality of internal registers.

FIG. 3 is a view exemplary showing the device output database 344 according to an embodiment of the present invention. When the existing test pattern is supplied in association with each of the plurality of existing test patterns, the device output database 344 holds the output to be obtained from the semiconductor device simulated by the device simulating means 40. For example, the device output database 344 may hold an index different from one another every existing test pattern and an output from the device simulating means 40 when the existing test pattern has been supplied, in association with each other. Here, the index may be generated as a unique value for a new test pattern when the new test pattern is generated by the test pattern generating means 300, or may be equal to the index in the test pattern database 316 shown in FIG. 2.

FIG. 4 is a view exemplary showing the termination register value database 364 according to an embodiment of the present invention. The termination register value database 364 holds the value of the internal register in the semiconductor device simulated by the device simulating means 40 after the existing test pattern stops being supplied, in association with each of the plurality of existing test patterns. For example, the termination register value database 364 may hold an index different from one another every existing test pattern and a value of the internal register when the existing test pattern has been supplied, in association with each other. Here, the index may be generated as a unique value for a new test pattern when the new test pattern is generated by the test pattern generating means 300, or may be equal to the index in the test pattern database 316 shown in FIG. 2. Moreover, the value of the internal register may include each value of the plurality of internal registers.

According to the test simulator 30 of an embodiment of the present invention, it is possible to hold a plurality of combinations of existing test patterns, values of the internal register when the existing test pattern begins to be supplied, an output of the semiconductor device when the existing test pattern has been supplied, and values of the internal register when the existing test pattern stops being supplied. In this way, although various test patterns are used, it is possible to detect a part, which can be skipped in the simulation test, with high precision, to effectively shorten time required for the simulation test.

Figure 5:
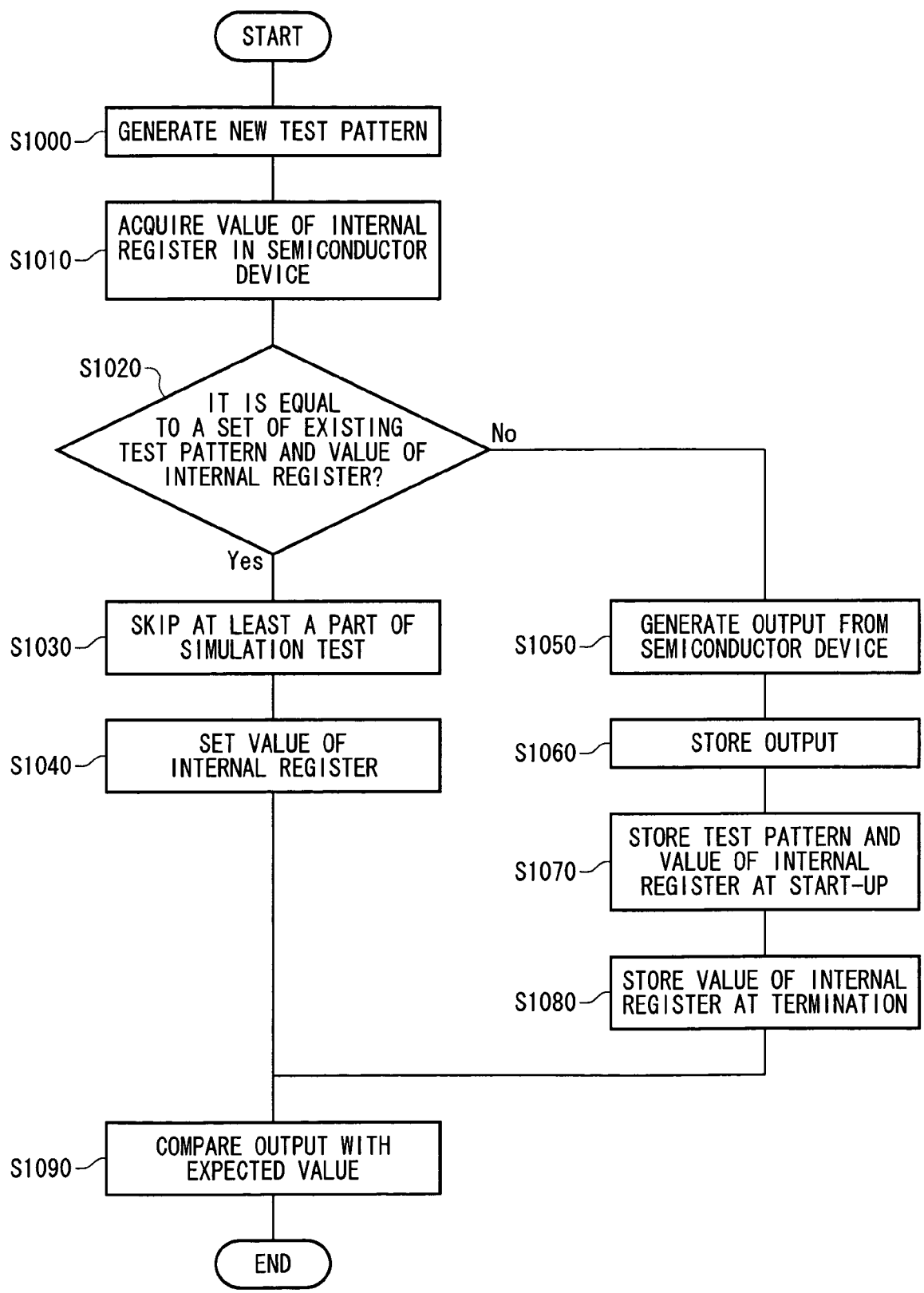
FIG. 5 is a flowchart exemplary showing a process flow in a test simulator 30 according to an embodiment of the present invention.

FIG. 5 is a flowchart exemplary showing a process flow in the test simulator 30 according to an embodiment of the present invention. At first, the test pattern generating means 300 generates a new test pattern to be supplied to the semiconductor device simulated by the device simulating means 40 (S1000). Then, the device output generating means 330 acquires a value of the internal register in the semiconductor device simulated by the device simulating means 40 from the device simulating means 40 (S1010). Then, the test pattern deciding means 320 detects whether a combination of a new test pattern generated from the test pattern generating means 300 and a value of the internal register in the semiconductor device simulated by the device simulating means 40 when the new test pattern begins to be supplied is equal to either of a plurality of combinations of existing test patterns held in the test pattern database 316 and values of the internal register in the semiconductor device when the existing test pattern begins to be supplied (S1020).

When the test pattern deciding means 320 decides that the previously described combination in the new test pattern is equal to either of the previously described combinations in each of the plurality of existing test patterns held in the test pattern database 316 (S1020: Yes), the simulation skipping means 350 skips at least a part of a simulation test by reading an output to be obtained from the semiconductor device, when the existing test pattern has been supplied to the semiconductor device, from the device output database 344 and using the output as an output from the semiconductor device for the new test pattern without supplying the new test pattern to the semiconductor device simulated by the device simulating means 40 (S1030) Then, the register value setting means 370 reads the value of the internal register in the semiconductor device simulated by the device simulating means 40, after the existing test pattern decided that it is equal to the new test pattern stops being supplied to the device simulating means 40, from the termination register value database 363, and sets it in the internal register in the semiconductor device (S1040).

On the other hand, when the test pattern deciding means 320 decides that the previously described combination in the new test pattern is not equal to either of the previously described combinations in each of the plurality of existing test patterns held in the test pattern database 316 (S1020: No), the device output generating means 330 generates an output from the semiconductor device by supply the new test pattern to the device simulating means 40 to operate the device simulating means 40 (S1050) Then, the device output storing means 342 stores the output of the semiconductor device generated from the device simulating means 40 according to the new test pattern on the device output database 344 (S1060). Then, the test pattern holding means 310 stores the new test pattern and the value of the internal register in the semiconductor device simulated by the device simulating means 40, when the new test pattern begins to be supplied to the device simulating means 40, on the test pattern database 316 (S1070). Then, the termination register value storing means 362 stores the value of the internal register in the semiconductor device simulated by the device simulating means 40, after the new test pattern stops being supplied to the device simulating means 40, on the termination register value database 364 (S1080).

The logic comparing means 390 compares an output corresponding to the existing test pattern read from the device output database 344 when the simulation test is skipped by the simulation skipping means 350 or an output that the device output generating means 330 makes the device simulating means 40 generate when the simulation test is not skipped, in order to decide the good or bad of the semiconductor device simulated by the device simulating means 40 (S1090). In addition, the test simulator 30 may repeat the above processes if necessary.

According to the test simulator 30 of an embodiment of the present invention, when the combination of the new test pattern and the value of the internal register when the new test pattern begins to be supplied is not equal to the combination of the existing test pattern and the value of the internal register when the existing test pattern begins to be supplied, it is possible to store the combination of the new test pattern, the value of the internal register when the new test pattern begins to be supplied, the output of the semiconductor device generated according to the new test pattern, and the value of the internal register after the output of the semiconductor device has been generated, as one of the combinations in the existing test patterns. In this way, when the same test pattern is used as a new test pattern after this, it is possible to skip the simulation test for the test pattern. In other words, although the above-described combination in the test pattern is not held previously, it is possible to effectively skip the simulation test to shorten time required for the simulation test as the simulation test is executed.

In addition, whether all registers in the semiconductor device simulated by the device simulating means 40 are equal may not be decided when the test pattern deciding means 320 decides whether the values of the internal register when the new test pattern begins to be supplied is equal, or it is preferable that the internal registers to be identical with one another when the same output is obtained by supplying the same test pattern are identical at least in a test simulated by the test simulator 30. Moreover, the test simulator 30 may decide that the combination of the new test pattern and the value of the internal register when the new test pattern begins to be supplied is equal to the combination of the existing test pattern and the value of the internal register when the existing test pattern begins to be supplied, and skip the simulation test without deciding whether the values of the internal register when the test pattern begins to be supplied are equal to each other, when a further new test pattern is equal to the existing test pattern after skipping the simulation test. Further, the test simulator 30 may decide that the combinations of the test patterns and the values of the internal register when the test patterns begin to be supplied are equal to each other, and not set the value of the internal register after the output of the semiconductor device is generated, when a new test pattern to be used subsequently is further equal to the existing test pattern when the simulation test has been skipped.

Figure 6:
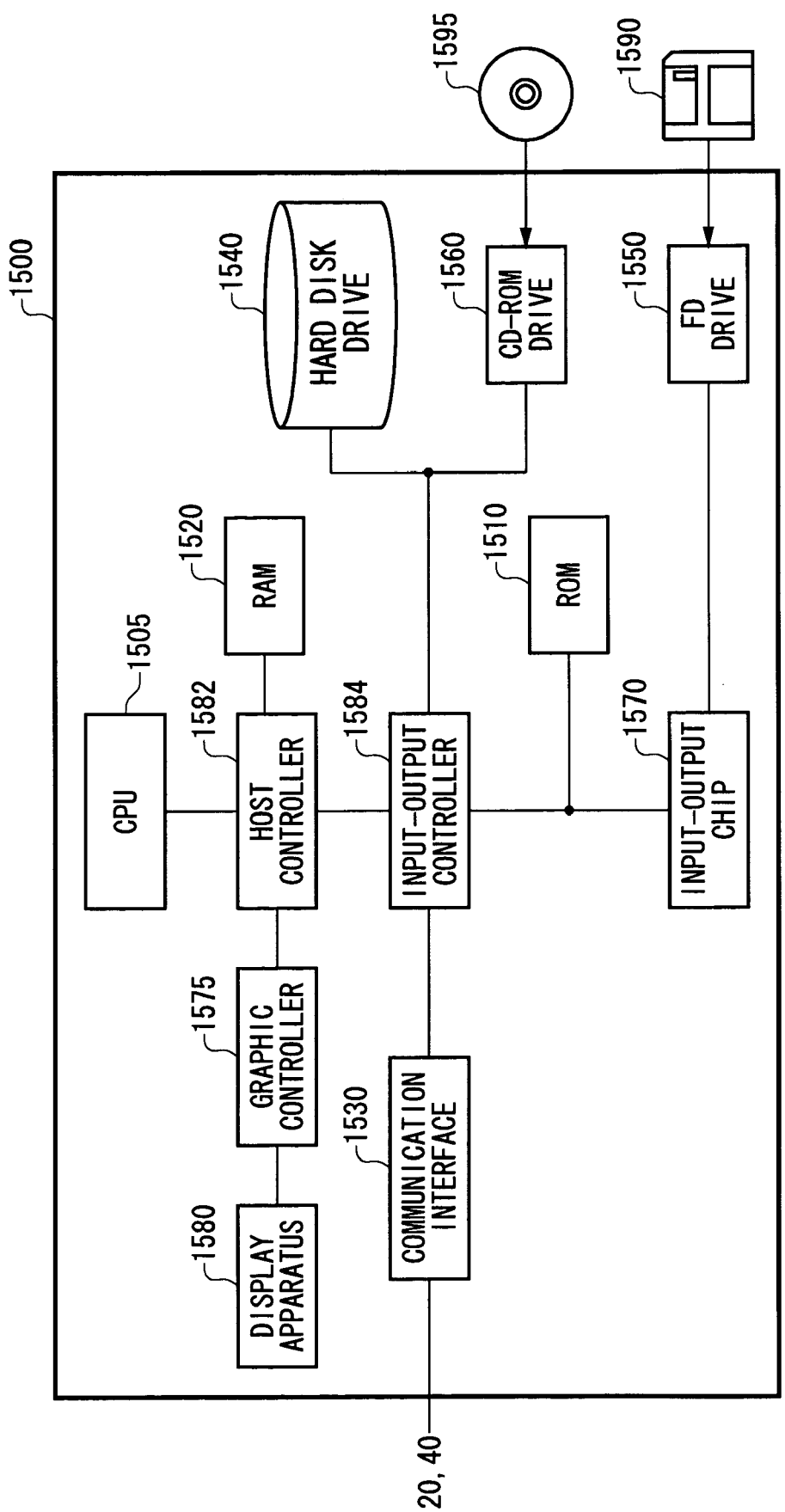
FIG. 6 is a block diagram exemplary showing a hardware configuration of a computer 1500 according to an embodiment of the present invention.

FIG. 6 is a block diagram exemplary showing a hardware configuration of a computer 1500 according to an embodiment of the present invention. The computer 1500 according to an embodiment of the present invention includes a CPU peripheral unit having a CPU 1505, a RAM 1520, a graphic controller 1575, and a display apparatus 1580 that are connected to one another via a host controller 1582, an input-output unit having a communication interface 1530, a hard disk drive 1540, and a CD-ROM drive 1560 that are connected to the host controller 1582 via an input-output controller 1584, and a legacy input-output unit having a ROM 1510, a flexible disk drive 1550, and an input-output chip 1570 that are connected to the input-output controller 1584.

The host controller 1582 connects the RAM 1520 to the CPU 1505 and the graphic controller 1575 that access the RAM 1520 at high transfer rate. The CPU 1505 operates based on a program stored on the ROM 1510 and the RAM 1520 to control each unit. The graphic controller 1575 acquires image data generated by the CPU 1505 on a frame buffer provided in the RAM 1520, and displays it on the display apparatus 1580. Alternatively, the graphic controller 1575 may include therein a frame buffer storing image data generated by the CPU 1505.

The input-output controller 1584 connects the host controller 1582 to the communication interface 1530, the hard disk drive 1540, and the CD-ROM drive 1560 that are a comparatively high-speed I/O apparatus. The communication interface 1530 communicates with other apparatuses through a network. The hard disk drive 1540 stores a program and data used by the CPU 1505 in the computer 1500. The CD-ROM drive 1560 reads the program or data from the CD-ROM 1595, and provides it to the hard disk drive 1540 via the RAM 1520.

Moreover, the input-output controller 1584 is connected to the ROM 1510 and an comparatively low-speed I/O apparatus such as the flexible disk drive 1550 and the input-output chip 1570. The ROM 1510 stores a boot program to be executed in starting the computer 1500, a programs depending upon the hardware of the computer 1500, and so on. The flexible disk drive 1550 reads the program or data from the flexible disk 1590, and provides it to the hard disk drive 1540 via the RAM 1520. The input-output chip 1570 connects various I/O apparatuses through the flexible disk drive 1550, or a parallel port, a serial port, a keyboard port, a mouse port, etc.

A test simulation program provided to the hard disk drive 1540 via the RAM 1520 is stored on a recording medium such as the flexible disk 1590, the CD-ROM 1595 or an IC card to be provided by a user. The test simulation program is read from the recording medium, is installed in the hard disk drive 1540 in the computer 1500 via the RAM 1520, and is executed by the CPU 1505. The test simulation program installed and executed in the computer 1500 is driven by the CPU 1505 to make the computer 1500 function as the test simulator 30 described in FIGS. 1 to 5.

The above-described program may be stored on an outside recording medium. The recording medium can include an optical recording medium such as DVD or PD, a magneto-optical recording medium such as MD, a tape medium, a semiconductor memory such as an IC card in addition to the flexible disk 1590 and the CD-ROM 1595. Moreover, a storage device such as a hard disk or a RAM that is provided in a server system connected to a private communication network and Internet is used as a recording medium, and the program may be provided to the computer 1500 via the network.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

According to the present invention, it is possible to provide a test simulator that effectively simulates a test to shorten time required for a simulation test when the test of a semiconductor device is simulated by means of a device simulator having slow operating speed as compared with a real semiconductor device.

What is claimed is:

1. A test simulator simulating a test of a semiconductor device, comprising:
   a test pattern holding means for holding a plurality of existing test patterns and for holding a value of an internal register in the semiconductor device for a simulation test;
   a device output holding means for preliminarily holding an output obtained in response to one of the existing test patterns;
   a test pattern generating means for generating a new test pattern for the simulation test;
   a test pattern deciding means for deciding whether the new test pattern is equal to one of the existing test patterns;
   a simulation skipping means for skipping at least a part of the simulation test by reading the output from said device output holding means and using the output as an output in response to the new test pattern without supplying the new test pattern to the semiconductor device when the new test pattern is at least partially equal to the one of the existing test patterns and a value of the internal register in the semiconductor device when the new test pattern starts to be supplied for the simulation test is equal to the value of the internal register held in said test pattern holding means;
   a termination register value holding means for holding a value of the internal register in the semiconductor device after the one of the existing test patterns stops being supplied; and
   a register value setting means for setting the internal register in the semiconductor device to the value of the internal register held in said termination register value holding means when at least a part of the simulation test is skipped by said simulation skipping means.

2. The test simulator as claimed in claim 1, further comprising a device output generating means for supplying the new test pattern to a device simulating means simulating an operation of the semiconductor device to operate the device simulating means when the new test pattern is not equal to the one of the existing test patterns and generating a new output from the device simulating means.

3. The test simulator as claimed in claim 2, wherein the device simulating means is included in the test simulator.

4. The test simulator as claimed in claim 2, wherein said test pattern holding means comprises a test pattern storing means for storing the new test pattern generated by said test pattern generating means, and said device output holding means comprises a device output storing means for storing the new output from the semiconductor device generated by said device output generating means.

5. The test simulator as claimed in claim 2, wherein said test pattern holding means comprises a start register value storing means for receiving from said device simulating means and storing a plurality of values of the internal register in the semiconductor device when the new test pattern starts to be supplied to said device simulating means.

6. The test simulator as claimed in claim 5, wherein
   said test pattern holding means holds a plurality of combinations of one of the existing test patterns and one of the values of the internal register in the semiconductor device when the one of the existing test patterns starts to be supplied to said device simulating means,
   said device output holding means holds a plurality of outputs each in association with at least one of the existing test patterns, and
   said simulation skipping means skips at least a part of the simulation test when a combination of the new test pattern and the value of the internal register in the semiconductor device when the new test pattern starts to be supplied is equal to any of the combinations held in said test pattern holding means.

7. The test simulator as claimed in claim 1, wherein
   said test pattern generating means generates the new test pattern for use in resuming the simulation test skipped by said simulation skipping means.

8. The test simulator as claimed in claim 2, wherein said termination register value holding means comprises a termination register value storing means for receiving from said device simulating means and storing a value of the internal register in the semiconductor device after the new test pattern stops, being supplied to said device simulating means.

9. A computer-readable storage medium containing a test simulation program, that when executed by a computer, instructs the computer to function as a test simulator simulating a test of a semiconductor device, the program comprising instructions for causing the computer to perform:
   holding a plurality of existing test patterns and a value of an internal register in the semiconductor device for the simulation test;
   preliminarily holding an output obtained in response to one of the existing test patterns;
   generating a new test pattern for the simulation test;
   deciding whether the new test pattern is equal to the one of the existing test patterns;
   skipping at least a part of the simulation test by reading the output held by said preliminarily holding and using the output as an output in response to the new test pattern without supplying the new test pattern to the semiconductor device when the new test pattern is at least partially equal to the one of the existing test patterns and a value of the internal register in the semiconductor device when the new test pattern starts to be supplied for the simulation test is equal to the value of the internal register held by said holding;
   holding a value of the internal register in the semiconductor device after the one of the existing test patterns stops being supplied; and
   setting the internal register in the semiconductor device to the value of the internal register after the one of the existing test patterns stops being supplied, held by said holding, when at least a part of the simulation test is skipped.

10. The computer-readable medium as claimed in claim 9, the program further comprising generating a new output from the semiconductor device in response to the new test pattern for simulating an operation of the semiconductor device when the new test pattern is not equal to the one of the existing test patterns.

11. The computer-readable medium as claimed in claim 10, wherein
   said holding a plurality of existing test patterns comprises storing the new test pattern generated, and
   said preliminarily holding an output comprises storing the new output from the semiconductor device generated in response to the new test pattern.

12. The computer-readable medium as claimed in claim 10, wherein said holding a plurality of existing test patterns comprises receiving and storing a plurality of the values of the internal register in the semiconductor device, when the new test pattern starts to be supplied for simulating an operation of the semiconductor device.

13. The computer-readable medium as claimed in claim 12, wherein said holding a plurality of existing test patterns comprises holding a plurality of combinations of one of the existing test patterns and one of the values of the internal register in the semiconductor device when the one of the existing test patterns starts to be supplied for simulating an operation of the semiconductor device, said preliminarily holding an output comprises holding a plurality of outputs each in association with at least one of the plurality of existing test patterns, and at least a part of the simulation test is skipped when a combination of the new test pattern and the value for the internal register in the semiconductor device when the new test pattern starts to be supplied is equal to any of the combinations held.

14. The computer-readable medium as claimed in claim 10, the program further comprising:

generating the new test pattern for use in resuming the simulation test skipped.

15. The computer-readable medium as claimed in claim 14, wherein said holding a value of the termination register comprises receiving and storing a value of the internal register in the semiconductor device after the new test pattern stops being supplied.

* * * * *